United States Patent
Kim

(10) Patent No.: US 9,825,137 B2
(45) Date of Patent: Nov. 21, 2017

(54) SEMICONDUCTOR ELEMENT AND METHOD FOR PRODUCING THE SAME

(71) Applicant: MagnaChip Semiconductor, Ltd., Cheongju-si (KR)

(72) Inventor: Youngjae Kim, Incheon-si (KR)

(73) Assignee: Magnachip Semiconductor, Ltd., Cheongju-si (KR)

( * ) Notice: Subject to any disclaimer, the term of this patent is extended or adjusted under 35 U.S.C. 154(b) by 0 days.

(21) Appl. No.: 14/219,874

(22) Filed: Mar. 19, 2014

(65) Prior Publication Data
US 2015/0069536 A1     Mar. 12, 2015

(30) Foreign Application Priority Data

Sep. 12, 2013 (KR) .................. 10-2013-0109440

(51) Int. Cl.
| | | |
|---|---|---|
| H01L 29/40 | (2006.01) | |
| H01L 29/78 | (2006.01) | |
| H01L 21/28 | (2006.01) | |
| H01L 29/423 | (2006.01) | |
| H01L 29/06 | (2006.01) | |

(52) U.S. Cl.
CPC ........ *H01L 29/407* (2013.01); *H01L 29/7811* (2013.01); *H01L 29/7813* (2013.01); *H01L 21/28238* (2013.01); *H01L 29/0638* (2013.01); *H01L 29/402* (2013.01); *H01L 29/42376* (2013.01)

(58) Field of Classification Search
CPC ............... H01L 29/407; H01L 29/7813; H01L 29/66719; H01L 29/66727; H01L 29/66734; H01L 29/7811; H01L 29/4941; H01L 21/28044; H01L 29/66477
See application file for complete search history.

(56) References Cited

U.S. PATENT DOCUMENTS

| | | | |
|---|---|---|---|
| 5,728,604 A * | 3/1998 | Rha et al. ..................... 438/163 |
| 6,870,220 B2 | 3/2005 | Kocon et al. | |
| 7,091,573 B2 | 8/2006 | Hirler et al. | |
| 7,319,256 B1 | 1/2008 | Kraft et al. | |
| 7,385,248 B2 | 6/2008 | Herrick et al. | |
| 7,476,589 B2 | 1/2009 | Grebs et al. | |
| 7,504,303 B2 | 3/2009 | Yilmaz et al. | |
| 8,558,308 B1 * | 10/2013 | Blank ............... H01L 29/66348 257/335 |
| 2008/0035993 A1* | 2/2008 | Cao et al. ..................... 257/333 |
| 2009/0061585 A1* | 3/2009 | Banerjee et al. ............. 438/270 |
| 2009/0090968 A1* | 4/2009 | Ono .................... H01L 29/0619 257/341 |
| 2010/0065903 A1* | 3/2010 | Parthasarathy et al. ...... 257/329 |

(Continued)

*Primary Examiner* — Bitew Dinke
(74) *Attorney, Agent, or Firm* — NSIP Law

(57) ABSTRACT

A semiconductor element and a method for producing the same are provided. A semiconductor element includes an active region comprising trenches, a termination region outside the active region, a transient region disposed between the active region and the termination region, the transient region including an inside trench, in which a center poly electrode is disposed inside at least one of the trenches of the active region, at least two gate poly electrodes are disposed adjacent to an upper portion of the center poly electrode, a p-body region is disposed between upper portions of the trenches, and a source region is disposed at a side of the gate poly electrodes.

26 Claims, 8 Drawing Sheets

(56) References Cited

U.S. PATENT DOCUMENTS

| | | | |
|---|---|---|---|
| 2010/0072540 A1* | 3/2010 | Disney | 257/328 |
| 2010/0109077 A1* | 5/2010 | Banerjee | H01L 29/402 257/328 |
| 2010/0123192 A1* | 5/2010 | Burke et al. | 257/334 |
| 2010/0140689 A1* | 6/2010 | Yedinak | H01L 29/0692 257/330 |
| 2010/0224909 A1* | 9/2010 | Oohara et al. | 257/140 |
| 2010/0237414 A1* | 9/2010 | Hsieh | 257/337 |
| 2011/0233714 A1* | 9/2011 | Lu | H01L 29/66348 257/493 |
| 2011/0254070 A1* | 10/2011 | Hsieh | 257/315 |
| 2011/0316075 A1* | 12/2011 | Hsieh | 257/330 |
| 2012/0126284 A1* | 5/2012 | Matsuda | H01L 29/0619 257/139 |
| 2013/0168760 A1* | 7/2013 | Hsieh | H01L 29/407 257/330 |
| 2013/0334565 A1* | 12/2013 | Hutzler et al. | 257/139 |
| 2014/0008722 A1* | 1/2014 | Mariani | H01L 29/66666 257/334 |
| 2014/0264567 A1* | 9/2014 | Challa | 257/330 |
| 2014/0374871 A1* | 12/2014 | Hirabayashi et al. | 257/488 |
| 2015/0072485 A1* | 3/2015 | Takeuchi | H01L 29/66068 438/192 |

* cited by examiner

[FIG. 1]
TRENCH Mask
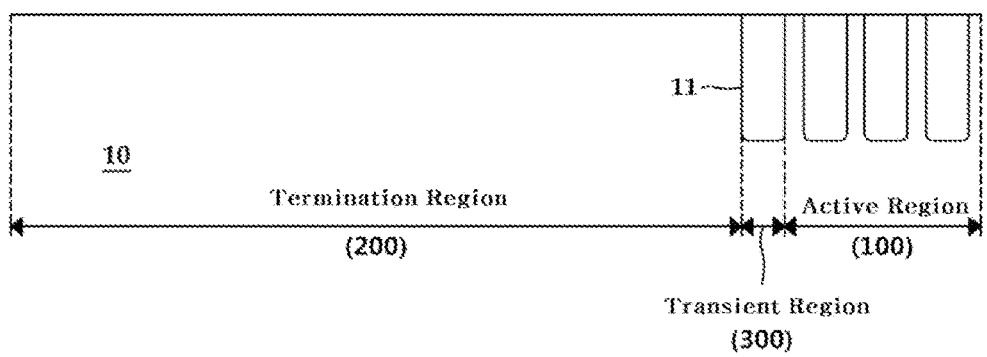
[FIG. 2]
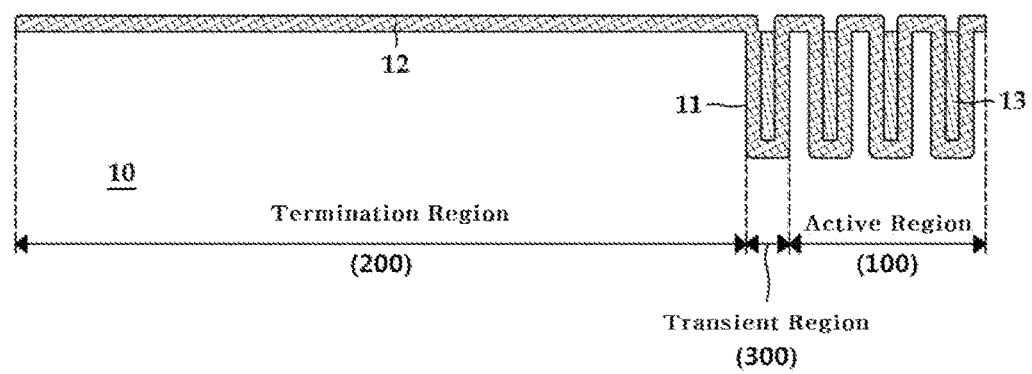

[FIG. 3]
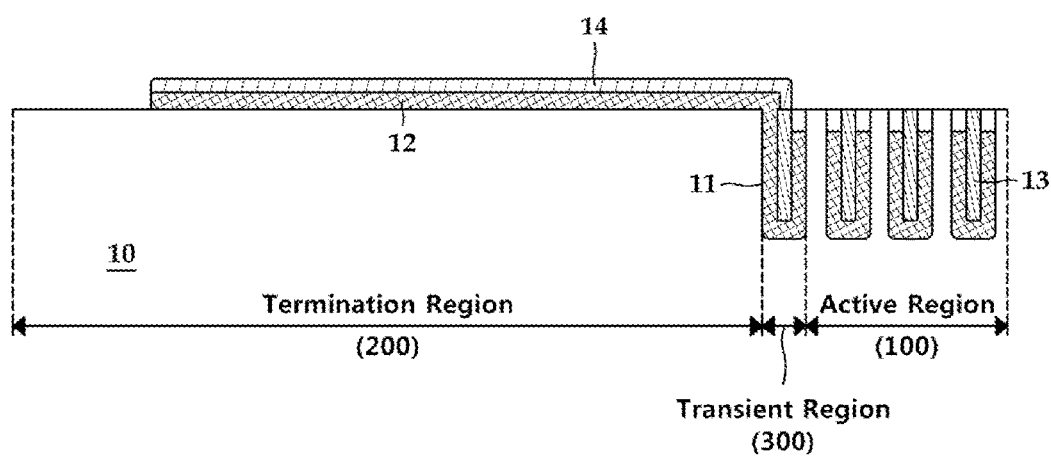
[FIG. 4]
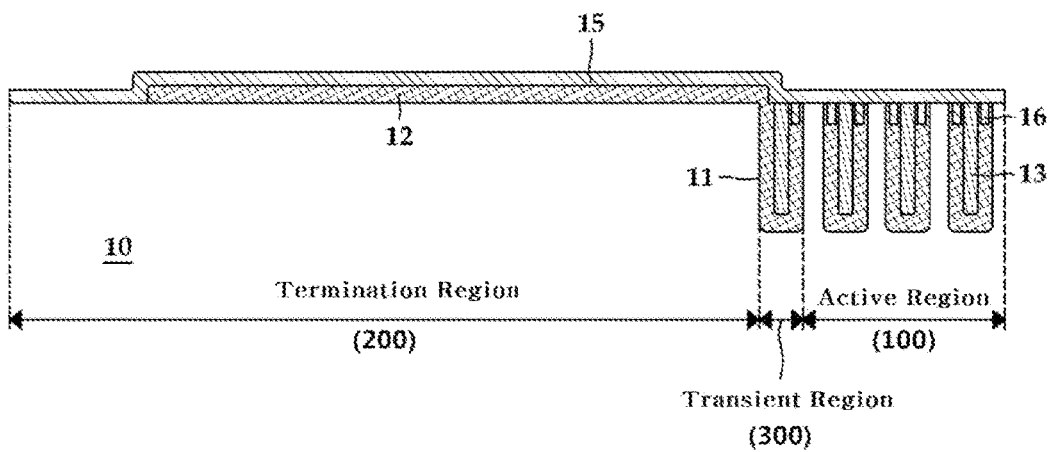

[FIG. 5]
BODY Mask
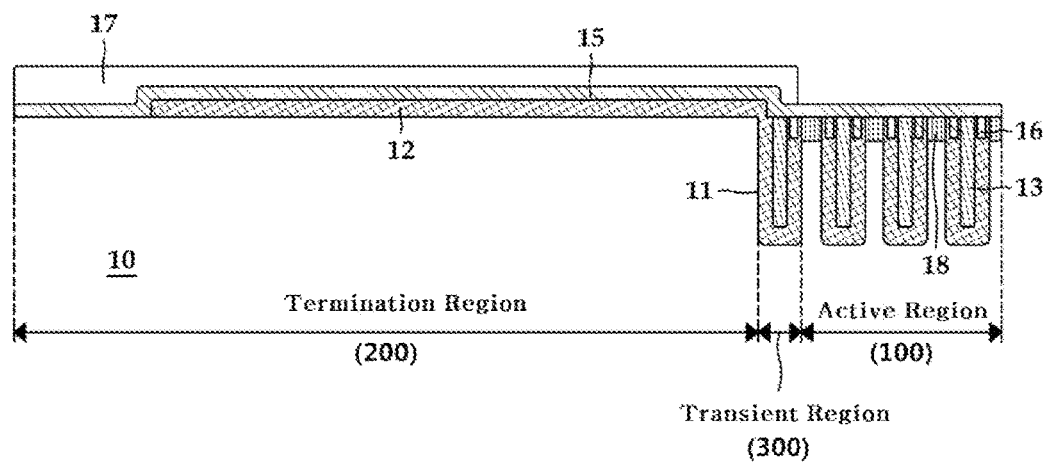
[FIG. 6]
POLYSILICON Mask
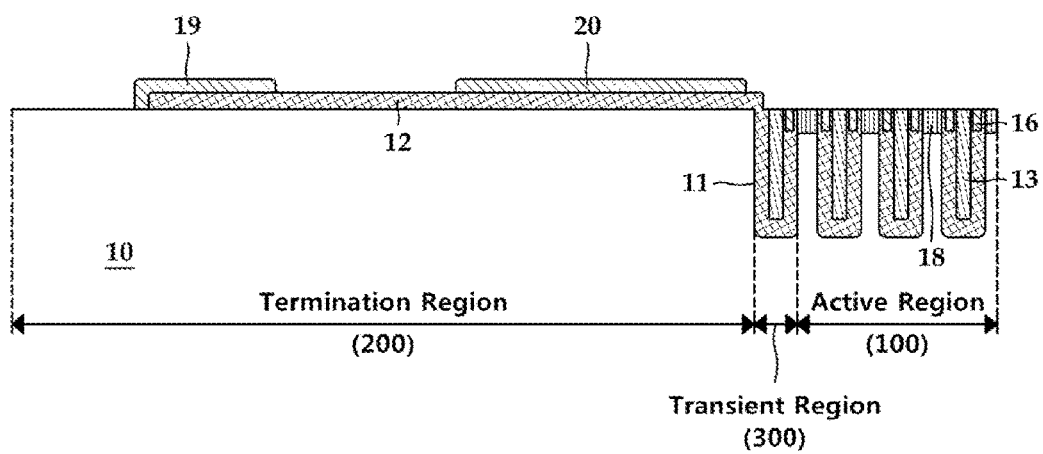

[FIG. 7]
SOURCE Mask
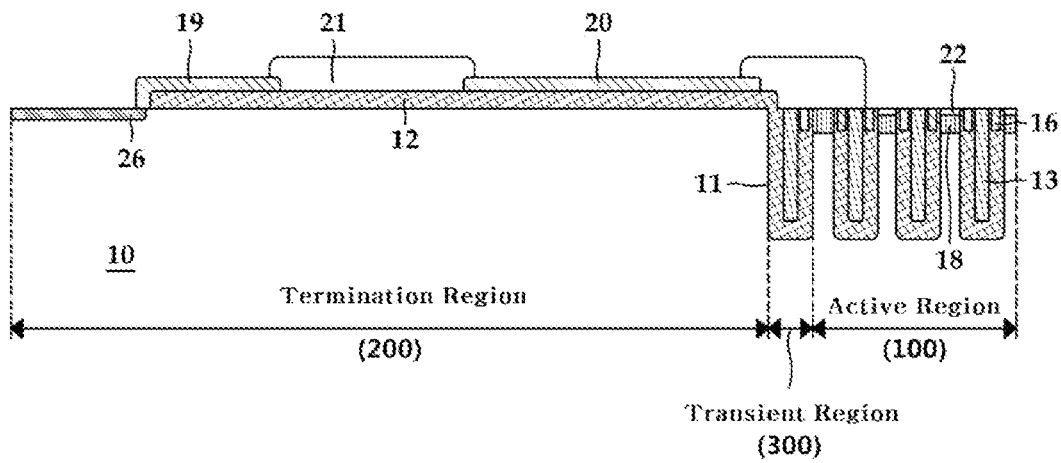
[FIG. 8]
CONTACT Mask
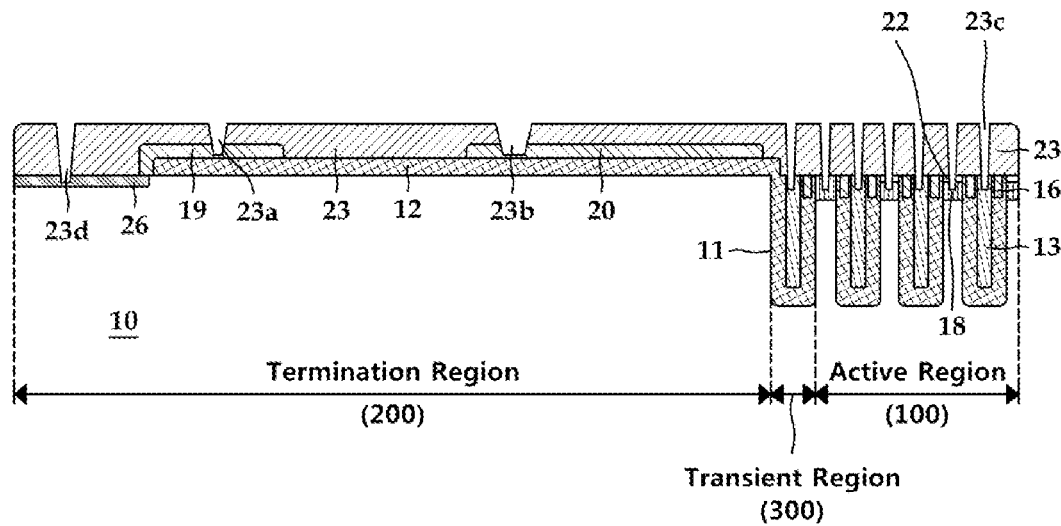

[FIG. 9]
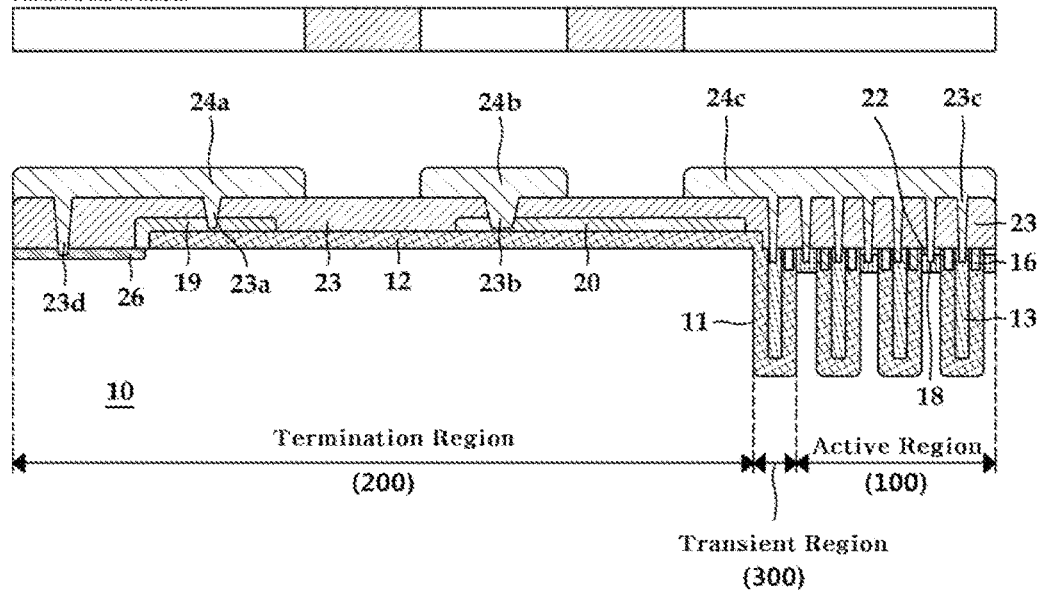
[FIG. 10]
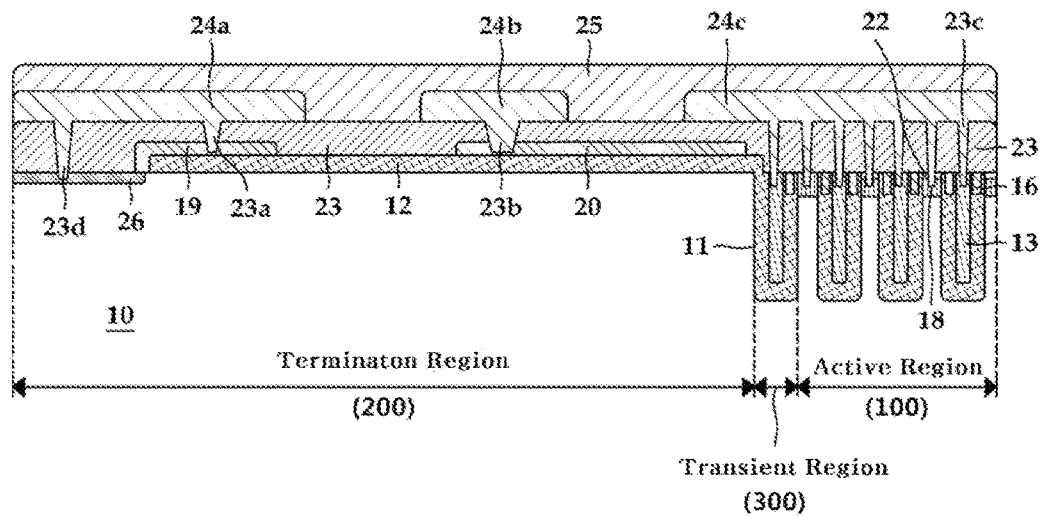

[FIG. 11]
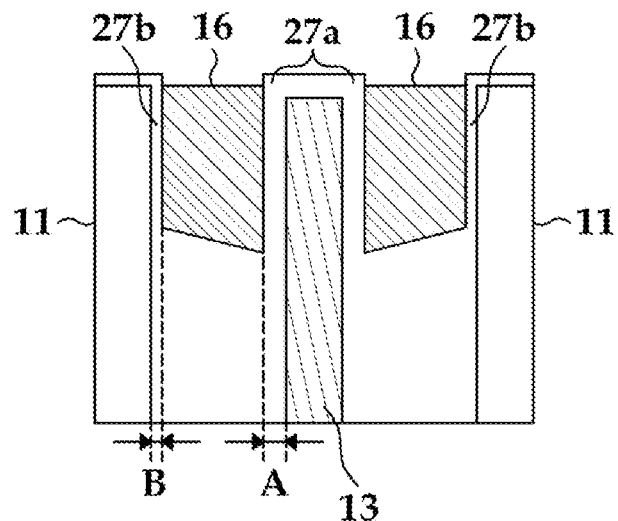
[FIG. 12]
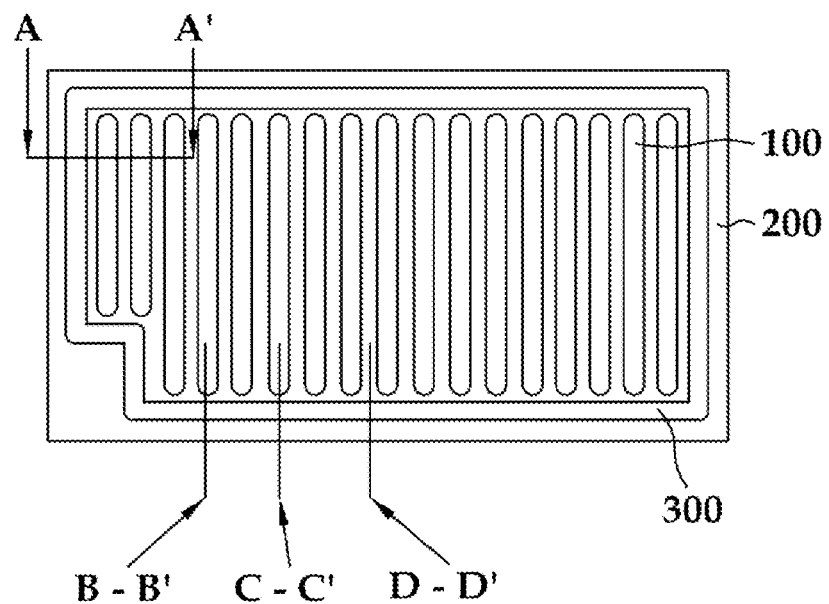

[FIG. 13]
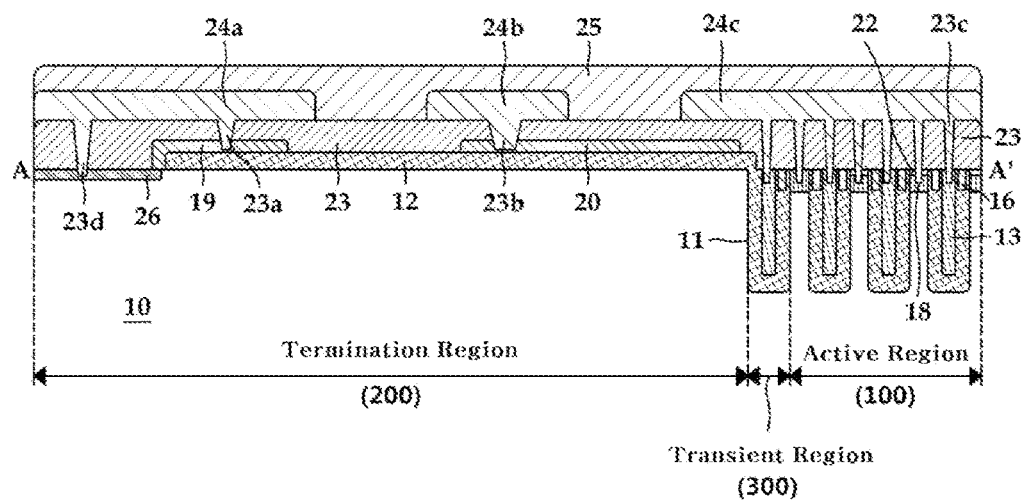
[FIG. 14]
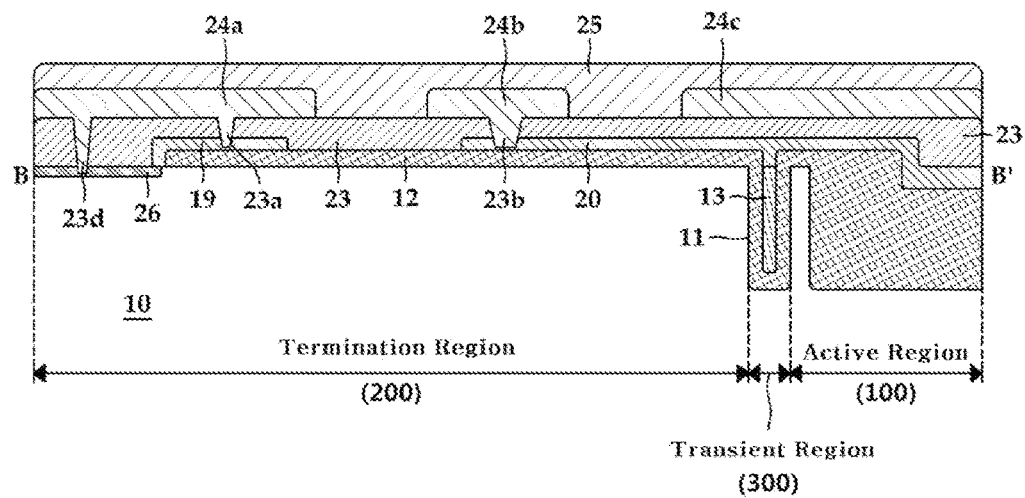

[FIG. 15]
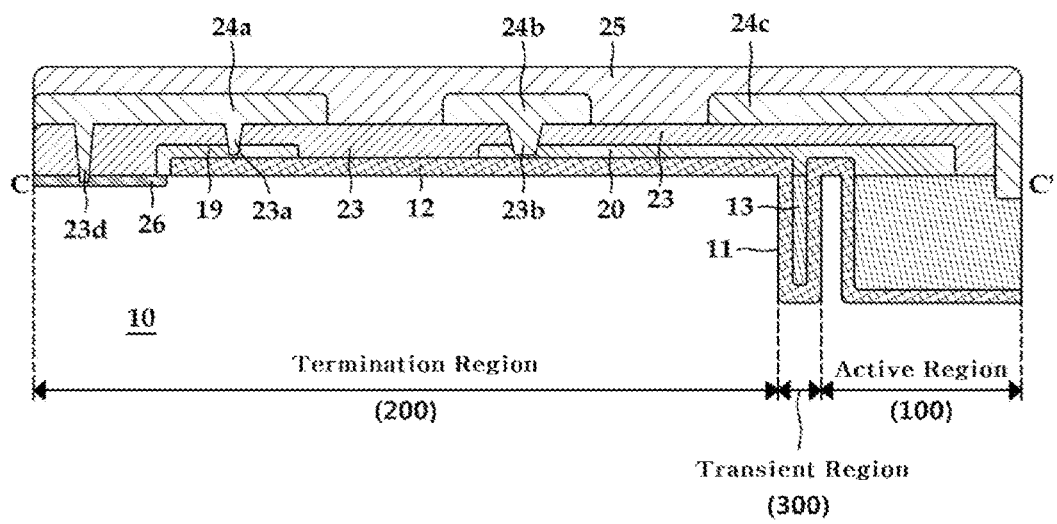
[FIG. 16]
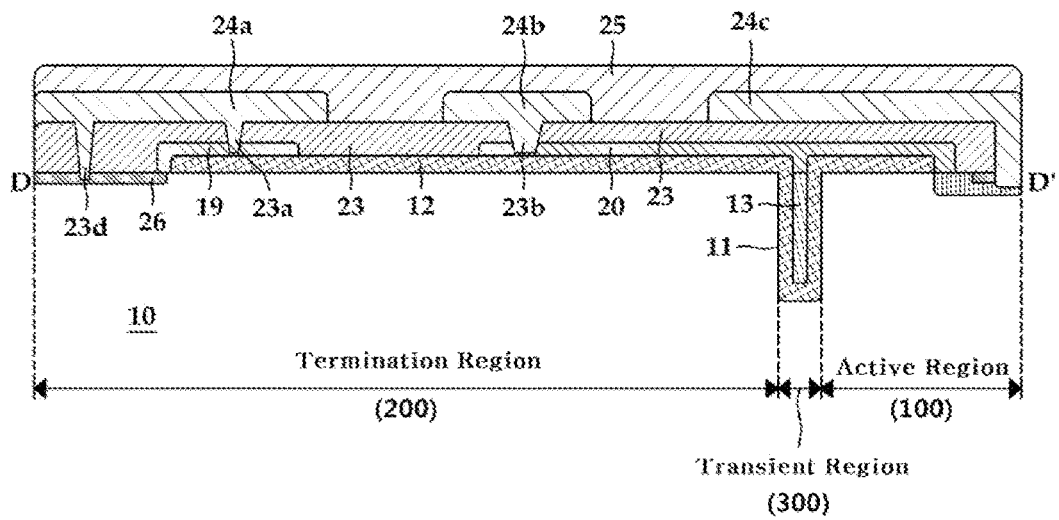

SEMICONDUCTOR ELEMENT AND METHOD FOR PRODUCING THE SAME

CROSS-REFERENCE TO RELATED APPLICATIONS

This application claims the benefit under 35 USC 119(a) of Korean Patent Application No. 10-2013-0109440 filed on Sep. 12, 2013, in the Korean Intellectual Property Office, the entire disclosure of which is incorporated herein by reference for all purposes.

BACKGROUND

1. Field

The following description relates to a semiconductor element and a method for producing the same, and to a semiconductor element of a triple poly structure and a method for producing the same.

2. Description of Related Art

A semiconductor element of a triple poly structure has a plurality of gate polies and a center poly in one trench.

This semiconductor element and the method of producing the same impose limitations in that a whole process is complicated because a via hole can be connected with a top metal after forming the vial hole by using separate masks during the processes of contact etches for an upper portion of the center poly and an upper portion of a p-body region.

In addition, if a contact process is performed with an upper metal through separate masks as usual, a severe metal difference caused therefrom occurs, and thus, a proceeding process followed by the succeeding process could bring a number of difficulties.

SUMMARY

This Summary is provided to introduce a selection of concepts in a simplified form that are further described below in the Detailed Description. This Summary is not intended to identify key features or essential features of the claimed subject matter, nor is it intended to be used as an aid in determining the scope of the claimed subject matter.

In one general aspect, a semiconductor element includes an active region comprising trenches, a termination region outside the active region, a transient region disposed between the active region and the termination region, the transient region comprising an inside trench, in which a center poly electrode is disposed inside at least one of the trenches of the active region, at least two gate poly electrodes are disposed adjacent to an upper portion of the center poly electrode, a p-body region is disposed between upper portions of the trenches, and a source region is disposed at a side of the gate poly electrodes.

The active region, the transient region and the termination region may be disposed within a substrate, and the termination region may not include a trench.

The general aspect of the semiconductor element may further include an extension gate poly electrode extending to the termination region from the trench of the transient region.

A source metal may electrically connect the center poly electrode and the source region. A gate metal may electrically connect the extended gate poly electrode. The source metal may be substantially coplanar to the gate metal.

The source metal may electrically connect the center poly electrode and the source region through via holes.

The source metal may include aluminum, the via holes may include tungsten, and a barrier metal including titanium or titanium nitride may be disposed at a bottom surface of the via holes and the source metal.

An insulating film including a high temperature low pressure deposition (HLD) oxide film and a borophosphosilicate glass (BPSG) film may be disposed between the via holes.

An equipotential ring metal may be disposed substantially coplanar to the source metal and the gate metal at a periphery of the termination region.

A channel stopper region may be disposed at a surface of a substrate under the equipotential ring metal.

The equipotential ring metal may be configured to be equipotential by connecting with the substrate through via holes that penetrate the channel stopper region.

The channel stopper region may be an n+ region.

An oxide layer may be disposed under the extension gate poly electrode.

The oxide layer may extend from at least one of the trenches in the active region to the termination region.

The center poly electrode may be disposed within the inside trench of the transient region, and the gate poly electrode is disposed within the inside trench of the transient region in a region closer to the active region than to the termination region.

The source region may be not disposed at the p-body region shared with the gate poly electrode formed in the inside trench.

A p+ region may be disposed at a bottom surface of the via holes.

A protective layer may be disposed on the source metal, the gate metal and the equipotential ring metal.

The protective layer may include a nitride film.

The gate insulating film may be disposed between a side of the trench and at least one of the gate poly electrodes, between the gate poly electrodes, and between the center poly electrode and a second center poly electrode, and the gate insulating film may be thicker between the gate poly electrode and the center poly electrode than between the side of the trench and the at least one of the gate poly electrode.

The bottom portion of the p-body region may be disposed on a bottom surface of the gate poly electrode.

Upper surfaces of the center poly electrode and the gate poly electrodes may be substantially coplanar to each other.

A depth of the inside trench in the transient region may be deeper than a depth of the trenches formed in the active region.

A bottom surface of the gate poly electrodes may incline toward the center poly electrode disposed between the gate poly electrodes.

A bottom portion of the gate poly electrodes close to the center poly electrode may be deeper than a bottom portion of the gate poly electrodes distant from the center poly electrode.

In another general aspect, a method for producing a semiconductor element involves: forming an active region, a termination region other than the active region, and a transient region such that the active region comprises trenches and the transient region between the active region and the termination region comprises an inside trench, in which the forming of the active region comprises: forming a center poly electrode at a center portion of each of the trenches in the active region; forming gate poly electrodes at both sides of an upper portion of the center poly electrode; forming an insulating film above the center poly electrode and the gate poly electrodes; forming simultaneously a plurality of via holes through the insulating film to electrically connect the center poly electrode and the gate poly electrodes. The inside trench of the transient region may have a different width than the trenches of the active region.

The forming of the gate poly electrodes may include: injecting impurities to sides of the trenches in the active region and an upper portion of the center poly electrode; forming a gate insulating film by oxidizing the sides of the trenches injected with the impurities and the center poly electrode; and etching at an upper portion of the gate insulating film after depositing the gate poly.

The method may involve forming a barrier metal comprising titanium or titanium nitride on a side surface and a bottom surface of the via holes.

The method may further involve forming a source metal connected with the center poly electrode and a gate metal connected with the gate poly electrodes, the source metal and the gate metal being substantially coplanar.

The forming of the center poly electrode and the gate poly electrodes may be characterized in that an upper surface of the center poly electrode and an upper surface of the gate poly electrodes are substantially coplanar to each other.

The insulating film may include a high temperature low pressure deposition (HLD) oxide film and a borophosphosilicate glass (BPSG) film.

Other features and aspects will be apparent from the following detailed description, the drawings, and the claims.

BRIEF DESCRIPTION OF THE DRAWINGS

FIGS. 1 through 9 illustrate an example of a method of producing a semiconductor element.

FIG. 10 illustrates a cross-sectional view of an example of a semiconductor element obtained by the method illustrated in FIGS. 1-9.

FIG. 11 illustrates a magnified cross-sectional view of an upper portion of a trench according to an example of a semiconductor element illustrated in FIG. 10.

FIG. 12 illustrates a plan view of an example of a semiconductor element.

FIG. 13 illustrates a cross-sectional view of an example of a trench along line A-A' of FIG. 12.

FIG. 14 illustrates a cross-sectional view of an example of a gate poly along line B-B' of FIG. 12.

FIG. 15 illustrates a cross-sectional view of an example of a center poly along line C-C' of FIG. 12.

FIG. 16 illustrates a cross-sectional view of an example of a p-body region outside an active region along line D-D' of FIG. 12.

Throughout the drawings and the detailed description, unless otherwise described or provided, the same drawing reference numerals will be understood to refer to the same elements, features, and structures. The drawings may not be to scale, and the relative size, proportions, and depiction of elements in the drawings may be exaggerated for clarity, illustration, and convenience.

DETAILED DESCRIPTION

The following detailed description is provided to assist the reader in gaining a comprehensive understanding of the methods, apparatuses, and/or systems described herein. However, various changes, modifications, and equivalents of the systems, apparatuses and/or methods described herein will be apparent to one of ordinary skill in the art. The progression of processing steps and/or operations described is an example; however, the sequence of and/or operations is not limited to that set forth herein and may be changed as is known in the art, with the exception of steps and/or operations necessarily occurring in a certain order. Also, descriptions of functions and constructions that are well known to one of ordinary skill in the art may be omitted for increased clarity and conciseness.

The features described herein may be embodied in different forms, and are not to be construed as being limited to the examples described herein. Rather, the examples described herein have been provided so that this disclosure will be thorough and complete, and will convey the full scope of the disclosure to one of ordinary skill in the art.

Unless indicated otherwise, a statement that a first layer is "on" a second layer or a substrate is to be interpreted as covering both a case where the first layer is directly contacts the second layer or the substrate, and a case where one or more other layers are disposed between the first layer and the second layer or the substrate.

The spatially-relative expressions such as "below", "beneath", "lower", "above", "upper", and the like may be used to conveniently describe relationships of one device or elements with other devices or among elements. The spatially-relative expressions should be understood as encompassing the direction illustrated in the drawings, added with other directions of the device in use or operation. Further, the device may be oriented to other directions and accordingly, the interpretation of the spatially-relative expressions is based on the orientation.

The expression such as "first conductivity type" and "second conductivity type" as used herein may refer to the conductivity types such as n or p types which are opposed to each other, and an example explained and exemplified herein encompasses complementary examples thereof.

Hereinafter, various embodiments of the present disclosure will be described in detail in reference to the drawings.

According to some examples, a method for forming a semiconductor element involves simultaneously forming various via holes at an insulating film in order to electrically connect a center poly electrode and a gate poly electrode respectively.

Additionally, some examples relate to a semiconductor element and a method for producing the same which forms the source metal connected with the center poly electrode through a plurality of via holes and the gate metal connected with the gate poly electrode, the source metal and the gate metal being substantially coplanar to each other.

FIGS. 1 through 9 illustrate cross-sectional views of a semiconductor element during an example of a method of producing the semiconductor element. FIG. 10 illustrates an example of semiconductor element that is obtained by the method illustrated in FIG. 1-9. FIG. 11 illustrates a magnified cross-sectional view of an upper portion of a trench of the semiconductor element illustrated in FIG. 10.

Referring to FIG. 11, a semiconductor element according to an example includes: a substrate 10; an active region 100 including a plurality of trenches 11 formed on the substrate 10; a termination region 200 other than the active region 100; and a transient region 300 including at least one trench 11 formed between the active region 100 and the termination region 200. The plurality of trenches 11 of the active region 100 include therein a center poly electrode 13 formed at the center of the trench, and at least two gate poly electrodes 16 formed at the side of the upper portion of the center poly electrode 13. A p-body region 18 and an upper portion of the p-body region 18 are formed between upper portions of the plurality of trenches 11. Further, a plurality of via holes 23c are formed in order to electrically connect a source region 22 formed at a side of the gate poly electrode 16 and the center poly electrode 13 and source region 22. Further, an extension gate poly electrode 20 extends to the termination region 200 from the trenches 11. Polysilicon may be used as a material for forming the gate poly electrodes 16 and the center poly electrode 13.

A source metal 24c electrically connecting the center poly electrode 13 and the source region 22, and a gate metal 24b electrically connecting the extended gate poly electrode 20 are formed substantially coplanar to each other.

The source metal 24c electrically connects the center poly electrode 13 and source region 22 through the various via holes 23c.

The source metal 24c and the via holes 23c consist of aluminum (Al) and tungsten (W) respectively. A barrier metal including titanium, titanium nitride or a combination thereof (Ti/TiN) is disposed at a side and a bottom portion of the source metal 24c and the via hole 23c.

A bottom portion of the p-body region 18 exists between a bottom portion of the gate poly electrode 16 and a bottom portion of the center poly electrode 13.

A p+ region exists at a bottom portion of the via holes 23c.

An equipotential ring (EQR) metal 24a is formed substantially coplanar to the source metal 24c and gate metal 24b at an exterior angle of the termination region 200.

An oxide layer 12 is disposed at a bottom portion of the extension gate poly electrode 20.

The oxide layer 12 may extend from the surfaces of the various trenches 11 formed on the active region 100 to the termination region 200.

The transient region 300 includes at least one trench formed between the active region 100 and the termination region 200. The inside trench 11 of the transient region 300 includes a center poly electrode 13 therein, and a gate poly electrode 16 is formed at a side of the upper portion of the inside trench 11 close to the active region 100 in an asymmetric structure with the center poly electrode 13 as a center. In this example, the gate poly electrode 16 is not disposed at a side of the inside trench 11 close to the terminal region 200.

A protective layer 25 is formed over the upper portions of the source metal 24c, gate metal 24b and equipotential ring metal 24a. The protective layer 25 includes a nitride film.

FIG. 11 illustrates a magnified cross-sectional view of an upper portion of a trench illustrated in FIG. 10. Referring to FIG. 11, the gate insulating films 27a, 27b exist between the side of the trench 11 and the gate poly electrode 16, and between the gate poly electrodes 16, and between the center poly electrodes 13, and a width A of the gate insulating film 27a between the gate poly electrode 16 and the center poly electrode 13 may be thicker than a width B of the gate insulating film 27b between the side of the trench 11 and the gate poly electrode 16.

Referring back to FIG. 10, the source region 22 may not exist at the p-body region 18 shared with the gate poly electrode 16 formed in the asymmetric structure.

A channel stopper region 26 may further exist at a surface of the substrate 10 of the bottom portion of the equipotential ring metal 24a.

The equipotential ring metal 24a becomes equipotential by being connected with the substrate 10 through via hole 23d contacted with the channel stopper region 26.

The via hole 23d is capable of being connected with the substrate by passing through the channel stopper region 26 and capable of injecting additionally a p+ ion to reduce a contact resistance with the substrate of the bottom portion of the via hole 23d.

The bottom portion of the p-body region 18 exists upon the bottom portion of the gate poly electrode 16.

The channel stopper region 26 is an N+ region.

The upper portions of the center poly electrode 13 and the gate poly electrode 16 are substantially coplanar to the surface of the substrate 10.

A depth of the trench 11 formed between the active region 100 and the termination region 200 may be deeper than that of the trench 11 formed in the active region 100.

The bottom portion of the gate poly electrode 16 may be formed as an inclined surface with the center poly electrode 13 as a center. For example, the bottom portion of the gate poly electrode 16 close to the center poly electrode 13 may be deeper than that of the gate poly electrode 16 distant therefrom, as illustrated in FIG. 11. An example of a method for producing a semiconductor element involves: forming an active region 100 including various trenches 11 formed on the substrate 10, a termination region 200 other than the active region 100, and a transient region 300 including at least one trench formed between the active region 100 and the termination region 200. The process of forming the active region 100 including the plurality of trenches 11 may involve: forming the center poly electrode 13 at the center portion of each trench 11 formed at the active region 100, forming the gate poly electrode 16 at the upper portions of both sides of the center poly electrode 13, forming the insulating film 23 at the upper portion formed of the center poly electrode 13 and gate poly electrode 16, simultaneously forming the various via holes 23a, 23b, 23c, 23d at the insulating film 23 in order to electrically connect each of the center poly and gate poly electrodes 13, 16.

Also, the forming of the gate poly electrode 16 may involve: injecting impurities at the sides of the various trenches 11 and the upper portion of the center poly electrode 13; forming gate insulating films 27a, 27b by oxidizing the sides of the trenches 11 injected with the impurities and center poly electrode 13; and etching at the upper portions of the gate insulating films 27a, 27b after depositing the gate poly.

The method may further involve forming the barrier metal including Ti/TiN at the sides and the bottom portions of the various via holes 23a, 23b, 23c, 23d.

The method may further involve forming the source metal 24c connected with the center poly electrode 13 through the various via holes 23a, 23b, 23c, 23d and the gate metal 24b connected with the gate poly electrode 16. The source metal 24c and the gate metal 24b may be substantially coplanar, as illustrated in FIG. 10.

The forming of the center poly electrode 13 and gate poly electrode 16 may be characterized in that the upper portion of the center poly electrode 13 and the upper portion of the gate poly electrode 16 may be substantially coplanar to the surface of the substrate 10.

The insulating film 23 includes a high temperature low pressure deposition (HLD) oxide film and a borophosphosilicate glass (BPSG) film.

An example of a method for producing a semiconductor element having the configuration described above will be described below by referring to FIGS. 1 through 9.

Referring to FIG. 1, a trench 11 is formed in an active region 100 of a side of a substrate 10.

For example, an n-type epi wafer substrate 10 is provided, and a deep trench hard masking procedure is performed on the substrate 10 using a trench mask. At this time, an etch process is performed by using stacked layer of a silicon nitride (NIT) and an silicon oxide as a hard mask because a photo resist (PR) by itself may not endure a dry etching process, such as a deep trench etching process, that may be subsequently performed.

After the etching process, a plurality of trenches 11 is formed by performing a deep trench photo and trench etch. A method of a trench etch performed may be an anisotropic dry etch process.

Afterward, the substrate 10 is oxidized with a sacrificial oxide film. At this time, when it comes to forming a first sacrificial oxide film, the surface of a silicon substrate 10 generated when performing trench etch, i.e., a plasma damage region brought when performing trench etch of the inside trench 11 is oxidized with the sacrificial oxide film, and then etch is removed and thus the plasma damage region of the surface of the surface of the trench 11 is removed.

Afterward, as illustrated in FIG. 2, an oxide layer 12 and the center poly electrode 13 are formed.

The oxide layer 12 may include a second sacrificial oxide layer, or a field oxide layer.

If the surface of the substrate 10 is oxidized, a higher rated voltage (a BVDSS) may be realized by electric field being distributed due to the oxide layer 12. A higher rating (the BVDSS) may be realized as the oxide layer 12 can serve a role in a reduced surface field effect (RESURF effect) such that sufficient electric field may be supported between the trenches and therefore a higher electric field formation can be obtained.

A formation of center poly electrode 13 is performed by a formation of doping poly, a poly oxide, a poly etch-back in order. The center poly electrode 13 is a middle electrode among the three gate poly electrodes formed in on trench 11 after a final process, and it is a poly electrode contacted with a source by a succeeding process through a source metal unlike two different right/left side poly electrodes.

To form a doping poly, the center poly electrode 13 doped of impurities (i.e., a dopant) for enhancing a conductivity of the poly electrode is formed.

To oxidize the poly, once the center poly electrode 13 is formed in the trench 11, an upper portion of the poly is oxidized for flattening a formation caused from a center portion of the center poly electrode 13 being formed as dented in the middle by a trench structure.

To perform the poly etch-back, the center poly electrode 13 is etched up to the upper portion of the oxide layer 12.

After this, the plasma damage region generated at the upper portion of the center poly electrode 13 is removed by oxidization when poly etch is performed. A formation of leakage current caused from the center poly electrode 13 is removed by the process in advance. Accordingly, the reliability of the device can be enhanced.

Afterward, referring to FIG. 3, the oxide layer 12 formed on the upper portions of the stopper region 26 and the substrate 10 of the active region 100 and the side of the trench 11 in the active region 100 is removed by merely etching the oxide layers 12 of the channel stopper region 26 and the active region 100 among the termination region with using photo resist mask 14.

After the removal, referring to FIG. 4, the gate poly is deposited at the entire sides of the substrate 10 after removing the partial portion of the oxide layer 12 and removing the photo resist mask.

The method may further involve forming the gate insulating films 27a, 27b before depositing the gate poly. Referring to FIG. 11, the method may further involve injecting an impurity ion to the entire sides before forming the gate insulating films 27a, 27b after removing the mask when forming the gate insulating films 27a, 27b. Accordingly, a thickness A of the gate insulating film 27a between the gate poly electrode 16 and the center poly electrode 13 could be thicker than a thickness B of the gate insulating film 27b between the trench 11 side and the gate poly electrode 16 to be formed. As described above, a high speed switching can be feasible by reducing a parasitism capacitance with the gate poly electrode 16 and the center poly electrode 13.

Afterward, referring to FIG. 5, a p-body region 18 is formed between the trenches 11 by using the p-body region mask. The p-body region 18 is formed through an implant of a p type dopant and spread in an n-type epi wafer substrate 10 as a p-well.

Next, referring to FIG. 6, the equipotential ring electrode 19 and the extension gate poly electrode 20 are formed at the termination region 200, and the gate poly electrode 16 is formed at an inside trench 11 of the active region 100 by selectively etching the gate poly electrode 16 using the poly mask.

Next, referring to FIG. 7, a source region 22 is formed at the upper portion of the p-body region 18 and simultaneously a channel stopper region 26 is formed at the termination region 200 through the source mask. The source region 22 may be formed at the upper portion of the inside p-body region 18 through implanting an n type dopant.

The equipotential ring metal 24a becomes equipotential by being connected through the channel stopper region 26 and via hole 23d. Also, the via hole 23d connected with the channel stopper region 26 may be equipotential by being connected with the substrate 10 by passing through the channel stopper region 26. The channel stopper region 26 may be an N+ region.

The channel stopper region 26 includes a depletion layer that extends when a P-N reverse bias is permitted, and serves a role of preventing the depletion layer from being further extended by performing a N+ or P+ doping in order that the depletion layer would not be extended to the chip edge accordingly.

Next, referring to FIG. 8, the insulating film region 23 is formed on the entire sides of the substrate after forming the source region 22. The insulating film 23 may be formed as a double layer of a high temperature low pressure deposition (HLD) oxide film and a borophosphosilicate glass (BPSG) film, and each via holes 23a, 23b, 23c, 23d are formed at the upper portions of the equipotential ring electrode 19, the extension gate poly electrode 20, the gate poly electrode 16, the center poly electrode 13 and the p-body region 18 by etching the insulating film region 23.

The insulating film region 23 insulates the gate electrode and the top metal to be performed on a succeeding process with an inter level dielectric (ILD). At this time, the via holes 23a, 23b, 23c, 23d are each formed at the corresponding portions to the equipotential ring electrode 19, the extension gate poly electrode 20, the gate poly electrode 16, the center poly electrode 13 and the p-body region 18 respectively by etching the insulting film region 23 with processes of contact photo and etch.

A p+ region is formed by implanting and annealing the p type dopant in the p-body region 18 through the each via holes 23a, 23b, 23c, 23d. In this regard, latch-up may be prevented by suppressing a turn-on easily through lowering the base resistance (Rb) of a NPN parasitic transistor in the p-body region 18 when reverse current passes.

Next, referring to FIG. 9, the equipotential ring metal 24a, gate metal 24b and source metal layer 24c are each formed at the upper portion of the insulating film region 23.

The equipotential ring metal 24a, gate metal 24b and source metal layer 24c are formed as metal layers at corresponding portions of the semiconductor element, respective to the equipotential ring electrode 19, gate poly electrode 20, center poly electrode 13 and p-body region 18 through each via hole 23a, 23b, 23c, 23d. Therefore, the above metal layers 24a, 24b, 24c consist of the equipotential ring metal layer 24a, gate metal layer 24b and source metal layer 24c.

As to the insulating film region 23, a barrier metal sputter method is applied in order to prevent Aluminum spike. The barrier metal consists of Ti/TiN and, afterward, forms the equipotential ring metal layer 24a, gate metal layer 24b and source metal layer 24c by forming a metal layer through Aluminum sputtering after filing a contact region (herein, a via hole) with a W-plug.

Afterward, referring to FIG. 10, by forming a protective layer 25 over the upper portions of the each metal layer 24a, 24b, 24c, a semiconductor element according to an example embodiment may be produced. In this example, the protective layer 25 may be formed of a material containing nitride film for protecting the chip on the each metal layers 24a, 24b, 24c.

FIG. 12 illustrates a plan view of an example of a semiconductor element. FIG. 13 illustrates a horizontal view of an example of a trench along line A-A' of FIG. 12. FIG. 14 illustrates a vertical view of an example of a gate poly along line B-B' of FIG. 12. FIG. 15 illustrates a vertical view of an example of a center poly along line C-C' of FIG. 12. FIG. 16 illustrates a vertical view of an example of a p-body region other than an active region along line D-D' of FIG. 12.

Referring to FIG. 10, in an example of the semiconductor element, the middle center poly electrode 13 connects with the equipotential ring metal layer 24a, gate metal layer 24b and source metal layers 24c by designing the gate poly electrode 16 merely within one side in the chip.

Therefore, a semiconductor element of a triple poly structure having two gate poly electrodes 16 and one center poly electrode 13 in one trench 11 is provided herein, and the additional mask process for connecting center poly may be omitted. Thus, the whole process can be simplified by performing a contact etch process of the upper portion of the center poly electrode 13 and a contact etch process of the p-body region 18 simultaneously, and thereby forming via holes simultaneously and thereby connecting with the top metal layers 24a, 24b, 24c.

While this disclosure includes specific examples, it will be apparent to one of ordinary skill in the art that various changes in form and details may be made in these examples without departing from the spirit and scope of the claims and their equivalents. The examples described herein are to be considered in a descriptive sense only, and not for purposes of limitation. Descriptions of features or aspects in each example are to be considered as being applicable to similar features or aspects in other examples. Suitable results may be achieved if the described techniques are performed in a different order, and/or if components in a described system, architecture, device, or circuit are combined in a different manner and/or replaced or supplemented by other components or their equivalents. Therefore, the scope of the disclosure is defined not by the detailed description, but by the claims and their equivalents, and all variations within the scope of the claims and their equivalents are to be construed as being included in the disclosure.

What is claimed is:

1. A semiconductor element comprising:
    a termination region outside an active region, the active region comprising trenches, wherein a center poly electrode is disposed inside at least one of the trenches;
    a transient region disposed between the active region and the termination region, the transient region comprising an inside trench;
    at least two gate poly electrodes are disposed adjacent to an upper portion of the center poly electrode;
    a p-body region disposed between upper portions of the trenches;
    a source region disposed at a side of the gate poly electrodes, wherein the source region is not disposed at the p-body region shared with the gate poly electrode formed in the inside trench;
    a channel stopper region disposed in the termination region, the channel stopper region including a via hole; and
    an equipotential ring metal disposed over the channel stopper region, the equipotential ring metal electrically connecting to the channel stopper region through the via hole included in the channel stopper region, wherein the via hole penetrates the channel stopper region.

2. The semiconductor element according to claim 1, wherein the active region, the transient region and the termination region are disposed within a substrate, and the termination region does not include a trench.

3. The semiconductor element according to claim 1, further comprising an extension gate poly electrode extending to the termination region from the trench of the transient region.

4. The semiconductor element according to claim 3, wherein a source metal electrically connects the center poly electrode and the source region, a gate metal electrically connects the extended gate poly electrode, and
    the source metal is substantially coplanar to the gate metal.

5. The semiconductor element according to claim 4, wherein the source metal electrically connects the center poly electrode and the source region through via holes.

6. The semiconductor element according to claim 5, wherein the source metal comprises aluminum, the via holes comprise tungsten, and a barrier metal comprising titanium or titanium nitride is disposed at a bottom surface of the via holes and the source metal.

7. The semiconductor element according to claim 6, wherein an insulating film comprising a high temperature low pressure deposition (HLD) oxide film and a borophosphosilicate glass (BPSG) film is disposed between the via holes.

8. The semiconductor element according to claim 4, wherein the equipotential ring metal is disposed substantially coplanar to the source metal and the gate metal at a periphery of the termination region.

9. The semiconductor element according to claim 8, wherein the channel stopper region is disposed at a surface of a substrate.

10. The semiconductor element according to claim 9, wherein the channel stopper region is an n+ region.

11. The semiconductor element according to claim 3, wherein an oxide layer is disposed under the extension gate poly electrode.

12. The semiconductor element according to claim 11, wherein the oxide layer extends from at least one of the trenches in the active region to the termination region.

13. The semiconductor element according to claim 1, wherein the center poly electrode is disposed within the inside trench of the transient region, and the gate poly electrode is disposed within the inside trench of the transient region in a region closer to the active region than to the termination region.

14. The semiconductor element according to claim 5, wherein a p+ region is disposed at a bottom surface of the via holes.

15. The semiconductor element according to claim 14, wherein a protective layer is disposed on the source metal, the gate metal and the equipotential ring metal.

16. The semiconductor element according to claim 15, wherein the protective layer comprises a nitride film.

17. The semiconductor element according to claim 1, wherein the gate insulating film is disposed between a side of the trench and at least one of the gate poly electrodes, between the gate poly electrodes, and between the center poly electrode and a second center poly electrode, and
wherein the gate insulating film is thicker between the gate poly electrode and the center poly electrode than between the side of the trench and the at least one of the gate poly electrode.

18. The semiconductor element according to claim 1, wherein a depth of the p-body region is disposed at an intermediate portion of a depth of the gate poly electrode.

19. The semiconductor element according to claim 2, wherein upper surfaces of the center poly electrode and the gate poly electrodes are substantially coplanar to each other.

20. The semiconductor element according to claim 1, wherein a depth of the inside trench in the transient region is deeper than a depth of the trenches formed in the active region.

21. The semiconductor element according to claim 1, wherein a bottom surface of the gate poly electrodes inclines toward the center poly electrode disposed between the gate poly electrodes.

22. The semiconductor element according to claim 1, wherein a bottom portion of the gate poly electrodes close to the center poly electrode is deeper than a bottom portion of the gate poly electrodes distant from the center poly electrode.

23. The semiconductor element according to claim 1, wherein a p+ region is disposed at a bottom surface of each of the via hole.

24. A semiconductor element comprising:
an active region comprising active trenches, wherein the active trenches comprise a first trench and a second trench, wherein each active trench includes a U-shaped portion of oxide layer, and wherein each U-shaped portion includes a left wall, a bottom, and a right wall;
a termination region outside the active region;
a transient region disposed between the active region and the termination region, the transient region comprising an inside trench;
a first center poly electrode located between a left wall of the first trench and a right wall of the first trench;
a left gate poly electrode located in a top region of the left wall of the first trench;
a right gate poly electrode located in a top region of the right wall of the first trench, wherein the left gate poly electrode and the right gate poly electrode are adjacent to an upper portion of the center poly electrode;
a p-body region located between the right wall of the first trench and a left wall of the second trench, and located horizontally to the right of the right gate poly electrode;
a source region located directly on top of the p-body region;
a channel stopper region disposed in the termination region, the channel stopper region including a via hole that penetrates the channel stopper region; and
an equipotential ring metal disposed over the channel stopper region, the equipotential ring metal electrically connecting to the channel stopper region through the via hole included in the channel stopper region,
wherein the first trench includes an outer left gate insulating film adjacent to a left surface of the left gate poly electrode, and an inner left gate insulating film adjacent to a right surface of the left gate poly electrode,
wherein the outer left gate insulating film has a thin width, the inner left gate insulating film has a thick width, and
wherein the thin width is smaller than the thick width.

25. A semiconductor element comprising:
a termination region disposed adjacent an active region, the active region including a trench;
a transient region disposed between the active region and the termination region, the transient region including an inside trench having a center poly electrode disposed therein, a width of the trench being different from a width of the inside trench;
an extension gate poly electrode disposed above entire planar upper surfaces of the inside trench and the trench;
an equipotential ring electrode disposed in the termination region; and
an insulating layer disposed between the equipotential ring electrode and a metal layer, and between the equipotential ring electrode and a channel stopper region,
wherein via holes respectively electrically connect the metal layer to the equipotential ring electrode and the channel stopper region.

26. A semiconductor element comprising:
a termination region disposed adjacent an active region, the active region including a trench having a center poly electrode disposed therein;
a transient region disposed between the active region and the termination region, the transient region including an inside trench, a width of the trench being different from a width of the inside trench;
an extension gate poly electrode disposed above an entire planar upper surface of the inside trench and a portion of a planar upper surface of the trench;
an equipotential ring electrode and a channel stopper region both disposed in the termination region; and
an insulating layer disposed between the equipotential ring electrode and a metal layer, and between the equipotential ring electrode and a channel stopper region,
wherein via holes respectively electrically connect the metal layer to the equipotential ring electrode and the channel stopper region.

* * * * *